United States Patent
Breisch et al.

(10) Patent No.: US 6,806,569 B2
(45) Date of Patent: Oct. 19, 2004

(54) MULTI-FREQUENCY POWER DELIVERY SYSTEM

(75) Inventors: James E. Breisch, Chandler, AZ (US); Mark A. Beiley, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 568 days.

(21) Appl. No.: 09/964,811

(22) Filed: Sep. 28, 2001

(65) Prior Publication Data

US 2004/0183171 A1 Sep. 23, 2004

(51) Int. Cl.[7] .............................................. H01L 23/34
(52) U.S. Cl. ........................ 257/728; 257/691; 257/723; 257/727
(58) Field of Search ................................ 257/728, 723, 257/724, 691, E23.079

(56) References Cited

U.S. PATENT DOCUMENTS

| | | | |
|---|---|---|---|
| 5,449,948 A | * | 9/1995 | Inoue et al. ................. 257/531 |
| 5,639,989 A | * | 6/1997 | Higgins, III ............ 174/35 MS |
| 5,719,750 A | * | 2/1998 | Iwane ......................... 361/794 |
| 5,973,910 A | | 10/1999 | Gardner |
| 5,977,631 A | * | 11/1999 | Notani ........................ 257/728 |
| 6,027,980 A | | 2/2000 | Gardner |
| 6,118,482 A | | 9/2000 | Clark et al. |
| 6,157,016 A | | 12/2000 | Clark et al. |
| 6,159,031 A | | 12/2000 | Llapitan et al. |
| 6,215,165 B1 | | 4/2001 | Connolly et al. |
| 6,222,246 B1 | | 4/2001 | Mak et al. |
| 6,235,549 B1 | | 5/2001 | Bawlock et al. |
| 6,243,134 B1 | | 6/2001 | Beiley |
| 6,259,145 B1 | | 7/2001 | Connolly et al. |
| 6,677,781 B2 | * | 1/2004 | Ishikawa et al. .............. 326/82 |
| 6,680,533 B1 | * | 1/2004 | Miyazawa .................. 257/728 |

* cited by examiner

*Primary Examiner*—Jasmine Clark
(74) *Attorney, Agent, or Firm*—Kenyon & Kenyon

(57) ABSTRACT

A mechanism is provided for delivering power to an on-die component (such as a buffer circuit). This may include a package unit having a low frequency delivery path and a high frequency delivery path and a die having the on-die component and a capacitive device each coupled in parallel between a first node and a second node. The die may further include a low frequency reception path and a high frequency reception path. The low frequency reception path may couple to the low frequency delivery path on the package unit and to the first node. The high frequency reception path may couple to the high frequency delivery path on the package unit and to the first node. The high frequency reception path may include a damping resistor.

26 Claims, 6 Drawing Sheets

MULTI-FREQUENCY POWER DELIVERY SYSTEM

FIELD

The present invention is directed to a power delivery system. More particularly, the present invention is directed to a power delivery system across a wide range of frequencies.

BACKGROUND

Integrated circuits are typically assembled into packages that are mounted to a printed circuit board. The printed circuit board may be incorporated into an electronic subassembly that may be plugged into a motherboard or printed circuit board.

It is generally desirable to have a semiconductor package that is more efficient and has a high decoupling capacitance and low inductance. The effective inductance can be lowered by connecting a decoupling capacitor near to a circuit (i.e., the effective inductance is lower by reducing the lead length). Inductance is a function of path length, therefore the longer the current path, the higher the inductance. High inductance, which yields higher supply noise in semiconductor packages, reduces the performance of integrated circuits (ICs). Also, inductance between an IC and a power supply can induce spurious voltage spikes in the power supply system, which can in turn cause timing problems in signal switching.

Decoupling capacitors may be housed on semiconductor packages in order to lower the inductance through the package by reducing the lead length. Decoupling capacitors placed close to power consuming circuits may smooth out voltage variations with a stored charge on the decoupling capacitor. The stored charge may dissipate or be used as a local power supply to device inputs, thereby allowing the decoupling capacitor to negate the effects of voltage noise induced into the system by parasitic inductance. However, off-chip decoupling capacitors may not be sufficient for very high-speed microprocessor and switching I/O applications. Since the decoupling capacitors are located a relatively long distance from the circuits, the time delay caused by the long inductance path may make the off-chip capacitors unusable with gigahertz switching circuits.

In order to sustain high frequency circuit operation, an ample amount of capacitive decoupling may be provided close to the circuits. Although it is possible to integrate chip capacitors within the chip's circuit elements, the capacitors compete for valuable die area that could be used for building additional circuits. Due to the limited area in which to build these capacitors, the overall capacitive decoupling that they provide may also be limited.

Many circuits place time varying current loads on their respective power delivery systems with various frequency components. For example, an I/O (input/output) buffer that drives a square wave requires a power delivery network capable of supplying all frequencies with low impedance. It is desirable to build a power delivery system for supplying power to integrated circuits which has the attribute of low impedance across a wide range of frequencies.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto.

The following represents brief descriptions of the drawings in which like reference numerals represent like elements and wherein.

DETAILED DESCRIPTION

Figure 1:
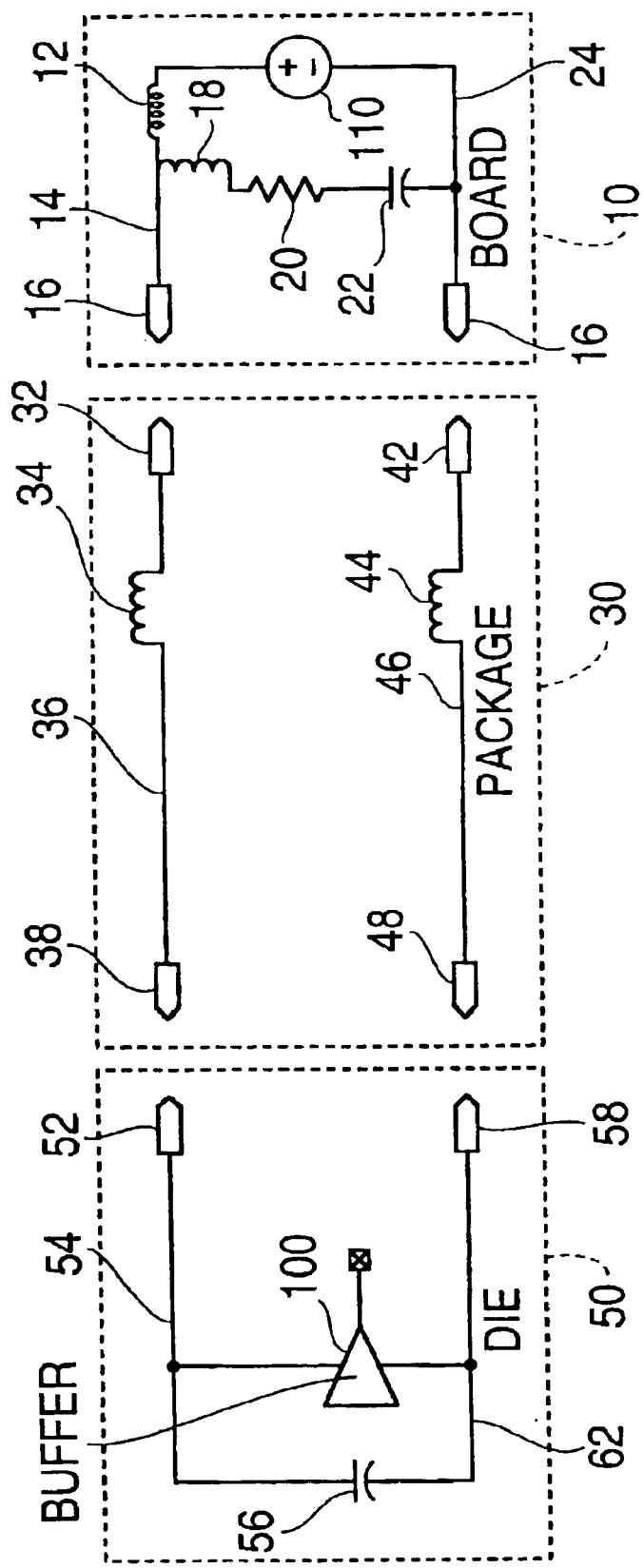
FIG. 1 is an example model of a power delivery network for an on-die buffer.

In the following detailed description, like reference numerals and characters may be used to designate identical, corresponding or similar components in differing figure drawings. Further, in the detailed description to follow, example values may be given although the present invention is not limited to the disclosed values. While values may be described as high values or low values, these descriptions of high and low values are intended to be relative to the discussed arrangement. That is, a value may be described as a high value in one arrangement although it may not be considered a high value if provided in another arrangement. Additionally, well known power/ground connections to components may not be shown within the FIGS. for simplicity of illustration and discussion, and so as not to obscure the invention. Further, where specific details are set forth in order to describe example embodiments of the invention, it should be apparent to one skilled in the art that the invention can be practiced without, or with variation of, these specific details. Finally, it should be apparent that differing combinations of hard-wired circuitry may be used to implement embodiments of the present invention. That is, the present invention is not limited to any specific combination of hardware.

Embodiments of the present invention may be shown or described with respect to models of certain components. It is understood that these models merely represent certain features of the components and that not all features are shown and/or modeled. For example, the figures may not specifically show all the inductance, capacitance and/or resistance of the respective components (such as the signal lines or connection means). Still further, embodiments of the present invention may be described with respect to a signal (s) or a signal line(s). These terminologies are intended to be interchangeable among each other and between the singular and plural. Further, arrangements and embodiments may be discussed with respect to a node or nodes. A node is intended to mean a relatively common conductive point, plane or pattern (such as a signal line). Additionally, signal lines may be described although one skilled in the art would understand that the signal lines may represent planes or layers of multi-layered devices.

Embodiments of the present invention may relate to a mechanism for delivering power to an on-die component such as a buffer circuit. The on-die component may have a high change in current over change in time value (i.e., a high di/dt). This mechanism may include a package (such as a semiconductor package) having a low frequency delivery path and a high frequency delivery path and a silicon die having the on-die component and a capacitive device (such as a decoupling capacitor). The on-die component and the capacitive device may be coupled in parallel between a first node and a second node. The silicon die may further include a low frequency reception path that couples to the first node and to the low frequency delivery path on the package, and a high frequency reception path that couples to the first node and to the high frequency delivery path on the package.

Embodiments of the present invention may thereby provide a low impedance power delivery network across a wide range of frequency. The network may be split into two branches with one branch having a dampening resistor. This split network may minimize the effects of tank resonance and power delivery while at the same time minimizing the voltage drop due to resistance damping devices and thereby provide a good low frequency response and a good high frequency response. Additionally, embodiments of the present invention may provide a novel implementation of a low Q, low resistance power delivery mechanism that is well suited to implementation on silicon integrated circuits.

FIG. 1 is an example model of a power delivery network for an on-die buffer (such as a buffer circuit provided on a silicon integrated circuit). More specifically, FIG. 1 shows a buffer 100 that is to be powered by a power supply device 110. In this implementation, a printed circuit board 10 (which includes the power supply 110) may be coupled to a package 30 that is in turn coupled to a silicon die 50 (that includes the buffer 100). FIG. 1 shows the power supply device 110 coupled to a signal line 14 through an internal or parasitic series inductor 12 and coupled to a signal line 24. One skilled in the art would understand that the series inductor 12 represents the inductance of the signal line 14 coupled to the power supply device 110. A capacitor 22, a resistor 20 and a series inductor 18 are shown in parallel with the series inductor 12 and the power supply device 110 between the signal line 14 and the signal line 24. The capacitor 22 may or may not be present but is often used intentionally as part of the power supply network. If the capacitor 22 is present, then the resistor 20 and the inductor 18 represent the effective internal resistance and inductance of the capacitor 22. The signal line 14 couples the power supply device 110 to a VCC connection mechanism 16 and the signal line 24 couples the power supply device 110 to a VSS connection mechanism 26.

The VCC connection mechanism 16, the VSS connection mechanism 26 and the VCC and/or VSS connection mechanisms to be described below may represent any number of well known mechanisms to couple modules (such as a printed circuit board, a semiconductor package and a silicon die) together.

FIG. 1 further shows the package 30 includes a VCC connection mechanism 32 coupled to a VCC connection 38 by a signal line 36. The model of the package 30 shows a series inductor 34 representing the inductance of the signal line 36. Similarly, a VSS connection mechanism 42 is coupled to a VSS connection mechanism 48 by a signal line 46. The model of the package 30 further shows a series inductor 44 representing the inductance of the signal line 46. The printed circuit board 10 may be coupled to the package 30 by the VCC connection mechanism 16 coupling to the VCC connection mechanism 32 and the VSS connection mechanism 26 coupling to the VSS connection mechanism 42 in any one of a number of well known manners.

The model of the silicon die 50 includes a VCC connection mechanism 52 coupled to a signal line 54 and a VSS connection mechanism 58 coupled to a signal line 62. The signal line 54 may correspond to one node and the signal line 62 may correspond to another node. A decoupling capacitor 56 is coupled between the signal line 54 (i.e., first node) and the signal line 62 (i.e., second node). The buffer 100 may also be coupled in parallel with the decoupling capacitor 56 between the signal line 54 and the signal line 62. The silicon die 50 may be coupled to the package 30 by the VCC connection mechanism 38 coupling to the VCC connection mechanism 52 and the VSS connection mechanism 48 coupling to the VSS connection mechanism 58.

Traditional wire bond power delivery systems may target minimizing the effective power delivery inductance. However, the power delivery inductance of traditional approaches may be high enough to create a tank resonance circuit within the frequency of desired operation. As is well known, the frequency of resonance may be defined by $$F = \frac{1}{2\pi\sqrt{LC}}$$

The capacitance term may be due to the on die decoupling of the capacitor 56 that keeps the edge rates high. The inductance term may be due to the inductance of the package 30 and the board 10 up to the first tier of board or package decoupling capacitance. Resonance of the power supply network may create widely varying on-die voltage when the resonance frequency is stimulated. This may cause circuit failure.

In order to combat the resonance power delivery, several approaches may be used. One method to combat the resonance is to reduce the amount of on-die decoupling capacitance so as to raise the frequency of resonance. That is, if the frequency of resonance is significantly higher than the maximum frequency of operation, then the chance of resonance stimulation is much lower. Another method is to reduce the amount of inductance in the power delivery path so as to increase the resonance frequency of the tank circuit. However, a reduction in the inductance may increase the cost due to more layers in the package, for example. Still another method is to include a series resistance in the power delivery network. The series resistance may act to de-Q the resonance. As is well known, the Q of the resonance may be represented by the following relationship:

$$Q \alpha \frac{1}{r}\sqrt{\frac{L}{C}}$$

By de-Qing the circuit, the maximum impedance of the power delivery network may be reduced so that the resonance is less of an issue. However, each of these options may have issues or drawbacks. That is, reducing the amount of on-die decoupling capacitance may dynamically increase the on-die voltage drop. Reducing the amount of inductance in the power delivery path may be desirable but usually is not practical to the degree needed in today's package technologies. That is, reducing the amount of inductance may involve an increase in cost. Further, including series resistance in the power delivery network may add constant impedance across all frequencies. Thus, at low frequencies, the voltage drop can be significant and intolerable.

In order to solve this and/or other problems, embodiments of the present invention may provide a power delivery network that includes an integrated circuit, a package substrate and a printed circuit board. The embodiments may deliver power to a component on the integrated circuit that has a high di/dt. That is, the component is susceptible to a high change in current over change in time. The power may be delivered to the high di/dt circuit by a split delivery network that includes a low frequency network and a high frequency network coupled in parallel (on the package) and isolated by damping resistance (on the package or on the die). The low frequency network may minimize the resistive components to create a voltage drop when DC or low frequency current is demanded. The high frequency network may minimize the inductive components to create a voltage drop when high di/dt demand occurs while at the same time minimizing the network resonance. Stated differently, splitting apart the power delivery path allows the use of a damping resistor in one path while the other path is without use of the damping resistor.

Figure 2:
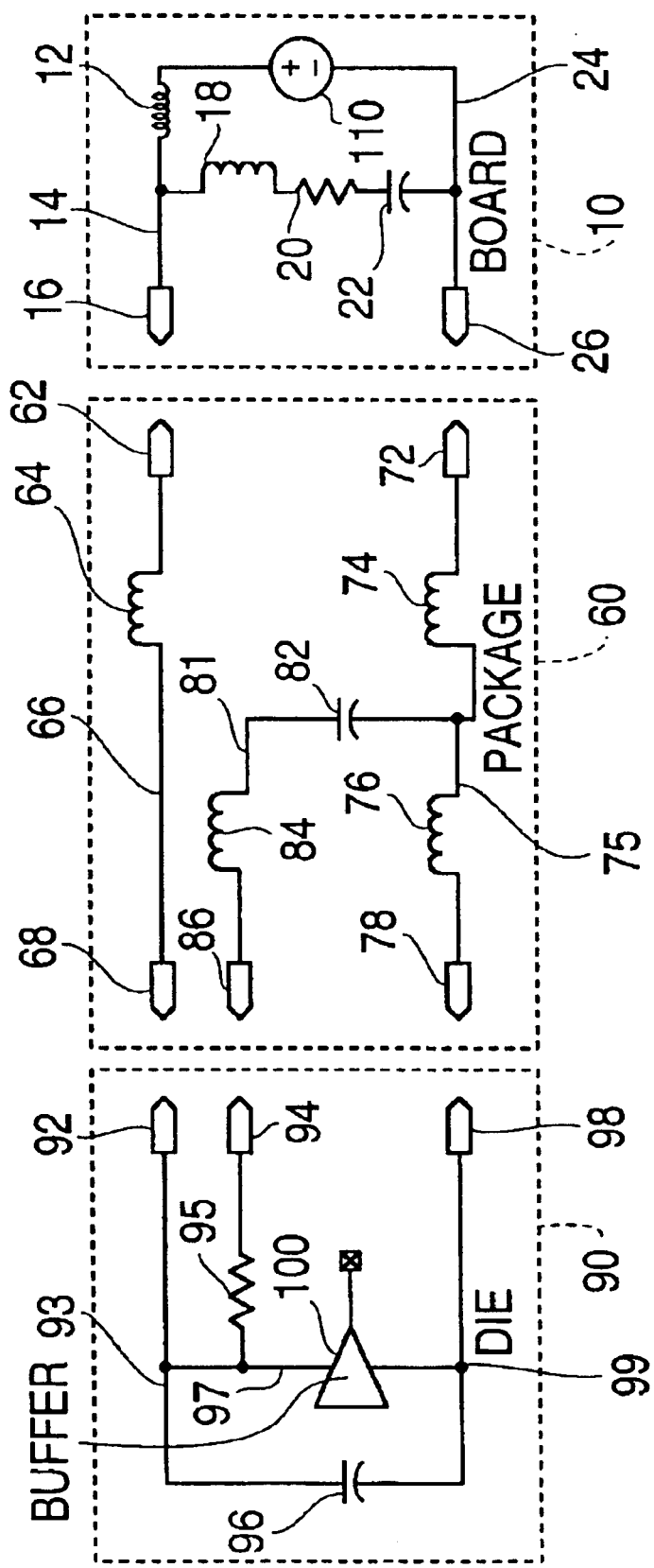
FIG. 2 is an example model of a power delivery network for an on-die buffer according to an embodiment of the present invention.

FIG. 2 shows an example model of a power delivery network or system for an on-die buffer according to an example embodiment of the present invention. Other embodiments and configurations are also within the scope of the present invention. More specifically, FIG. 2 shows the board 10 having the power supply device 110 for providing power, a package 60 (such as a six layer semiconductor package) and a silicon die 90. The board 10 is similar to the printed circuit board 10 of FIG. 1. Embodiments of the present invention are also applicable to the power supply device 110 being provided off of the board 10. The package 60 includes a VCC connection mechanism 62 coupled to a low frequency VCC connection mechanism 68 by a signal line 66. The model of the package 60 shows a series inductor 64 representing the inductance of the signal line 66. This path between the VCC connection mechanism 62 and the low frequency VCC connection mechanism 68 may be called a low frequency delivery path. The package 60 further includes a VSS connection mechanism 72 coupled to a VSS connection mechanism 78 by a signal line 75. The model of the package 60 shows a series inductor 74 and a series inductor 76 representing the inductance of the signal line 75. FIG. 2 further shows a capacitive element 82 coupled to the signal line 75 and also coupled to a high frequency VCC connection mechanism 86. The capacitive element 82 may represent one or a plurality of capacitors. The model of the package 60 shows a series inductor 84 representing the inductance of the signal line 81. This path between the derived VCC node 81 and the high frequency VCC connection mechanism 86 may be called a high frequency delivery path. The package 60 may be coupled to the board 10 by the VCC connection mechanism 62 coupling to the VCC connection mechanism 16, and the VSS connection mechanism 72 coupling to the VSS connection mechanism 26.

The silicon die 90 includes a low frequency VCC connection mechanism 92 coupled to a signal line 93, a high frequency VCC connection mechanism 94 coupled to a signal line 97 and a VSS connection mechanism 98 coupled to a signal line 99. The signal lines 93 and 97 may correspond to one common node while the signal line 99 may correspond to another node. A resistive element 95 is coupled between the high frequency VCC connection mechanism 94 and the signal line 97 (i.e., a node in common with the low frequency VCC connection mechanism 92). The resistive element 95 may represent one or a plurality of resistors. The high frequency VCC connection mechanism 94 and the resistive element 95 correspond to a high frequency reception path whereas the low frequency VCC connection mechanism 92 corresponds to a low frequency reception path. A decoupling capacitor 96 is coupled between the signal line 93 (i.e., the first node) and the signal line 99 (i.e., the second node). The decoupling capacitor 96 may represent one or a plurality of capacitors. The buffer 100 may also be coupled in parallel with the decoupling capacitor 96 between the first node (common to the signal line 93 and the signal line 97) and the signal line 99. The silicon die 90 may be coupled to the package 60 by the low frequency VCC connection mechanism 92 coupling to the VCC connection mechanism 68, the high frequency VCC connection mechanism 94 coupling to the high frequency VCC connection mechanism 86, and the VSS connection mechanism 98 coupling to the VSS connection mechanism 78.

The configuration of the split power delivery network includes a low frequency plane (or low frequency delivery path) within the package 60 to couple the board 10 to the die 90 (through a pad or bump, for example). This low frequency plane may not have resistive elements in series between the silicon of the die 90 and the board 10, but may be relatively inductive because of circuit package technology limits. Once the low frequency plane is coupled to the silicon die 90, the low frequency plane is coupled to the on-die decoupling capacitance (such as the decoupling capacitor 96) and the high di/dt component (such as the buffer 100). This may provide a low resistance power delivery network that is useful for circuits that burn DC currents with on-die termination.

Additionally, the low frequency plane (or low frequency delivery path) may be connected (by the previously described bump or pad, for example) to a series resistor (such as the resistive element 95) that comes back off of the die 90 and is coupled to a separate high frequency plane (or high frequency path) in the package 60. The high frequency plane (or path) in the package 60 may not have any electrical connection to the low frequency plane except through the series resistor (such as the resistive element 95) on the silicon of the die 90. The high frequency plane also may not have any direct connection to the board 10. A low inductance capacitor or a plurality of low inductance capacitors (shown as the capacitive element 82) may be coupled between the high frequency plane and the ground plane so as to create a low inductance decoupling plane that is damped through the on-silicon resistors (such as the resistive element 95). This combination network may therefore provide the low resistance and the low impedance power delivery needed for high di/dt circuits. The network may be implemented on existing flip chip ball grid array (FCBGA) package designs and a four-layered motherboard technology for high volume cost sensitive applications as well as other common packaging technologies.

In the FIG. 2 embodiment, the resistive element 95 may be used for de-Qing the resonance without impacting the DC performance.

Embodiments of the present invention may provide the de-Qing resistor integrated into the silicon components so as to allow a separated in-package local plane to deliver high frequency power through the resistive element(s) to the circuits. The high frequency power plane may be supplied through the on-die resistor (such as the resistive element 95) and act as a high frequency charge reservoir. The use of the on-die resistor implementation means that a discrete resistor (or resistors) does not have to be used on the package and thus saves cost and package area. This implementation of a multi-frequency power delivery solution may enable a ten times impedance reduction for one implementation when compared to more traditional implementations. Additionally, the integration of the de-Qing resistor into the silicon may reduce the cost and manufacturing complexity of the multi-frequency power delivery design.

Figure 3:
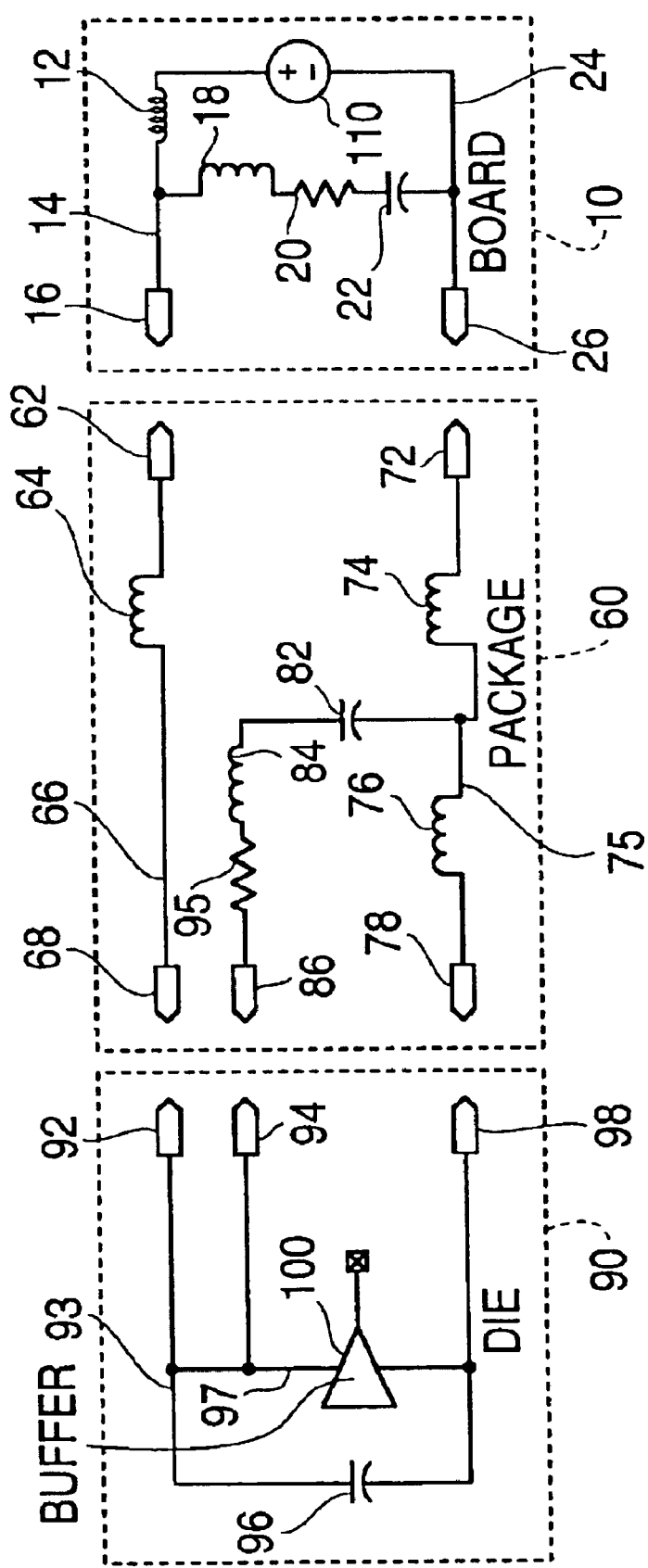
FIG. 3 is an example model of a power delivery network for an on-die buffer according to an embodiment of the present invention.
Figure 4:
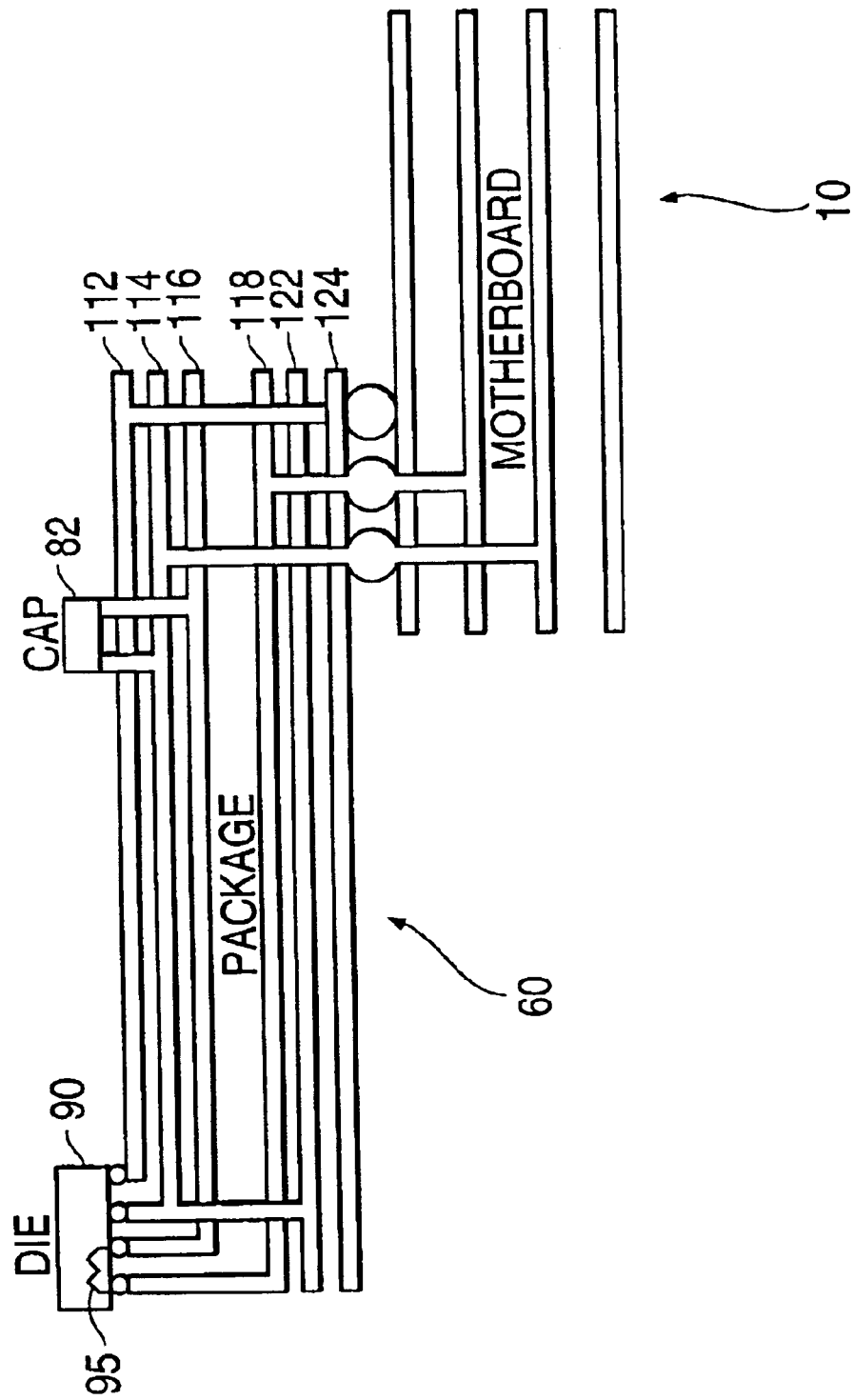
FIG. 4 illustrates planes of a split delivery network according to an example embodiment of the present invention.

FIG. 3 is an example model of a power delivery system for the on-die buffer 100 according to another example embodiment of the present invention. In this embodiment, the dampening resistor (such as the resistive element 95 in FIG. 2) is provided within the package 60 rather than the die 90. That is, as shown in FIG. 3, the resistive element 95 is provided between the capacitive element 82 and the high frequency VCC connection mechanism 86. More specifically, FIG. 3 shows the capacitive element 82 coupled to the signal line 75 and also coupled to the resistive element 95. The resistive element 95 is coupled to the high frequency VCC connection mechanism 86. The model of the package 60 shows a series inductor 84 representing the inductance of the signal line 81. This path between the VCC connection mechanism 72 and the high frequency VCC connection mechanism 86 may be called a high frequency delivery path FIG. 4 illustrates planes of a split delivery network according to an example embodiment of the present invention. Other embodiments and configurations are also within the scope of the present invention. More specifically, FIG. 4 shows the printed circuit board 10 coupled to the package 60. The package 60 is further coupled to the silicon die 90. In this example, the board 10 is shown as a four-layered motherboard and the package 60 is shown as a six-layered package coupled to the die 90. That is, the package 60 may include a signal line (or plane) 112, a VSS signal line (or plane) 114, a high frequency VCC signal line (or plane) 116, a low frequency VCC signal line (or plane) 118, a VSS signal line (or plane) 122 and a signal line (or plane) 124. FIG. 4 further shows the resistive element 95 coupled in parallel between the high frequency VCC signal line 116 and the low frequency VCC signal line 118. The capacitive element 82 is shown as being coupled between the VSS signal line 114 and the high frequency VCC signal line 116. In one embodiment, three capacitors each of 0.22 microfarad are used as the capacitive element 82.

Figure 5:
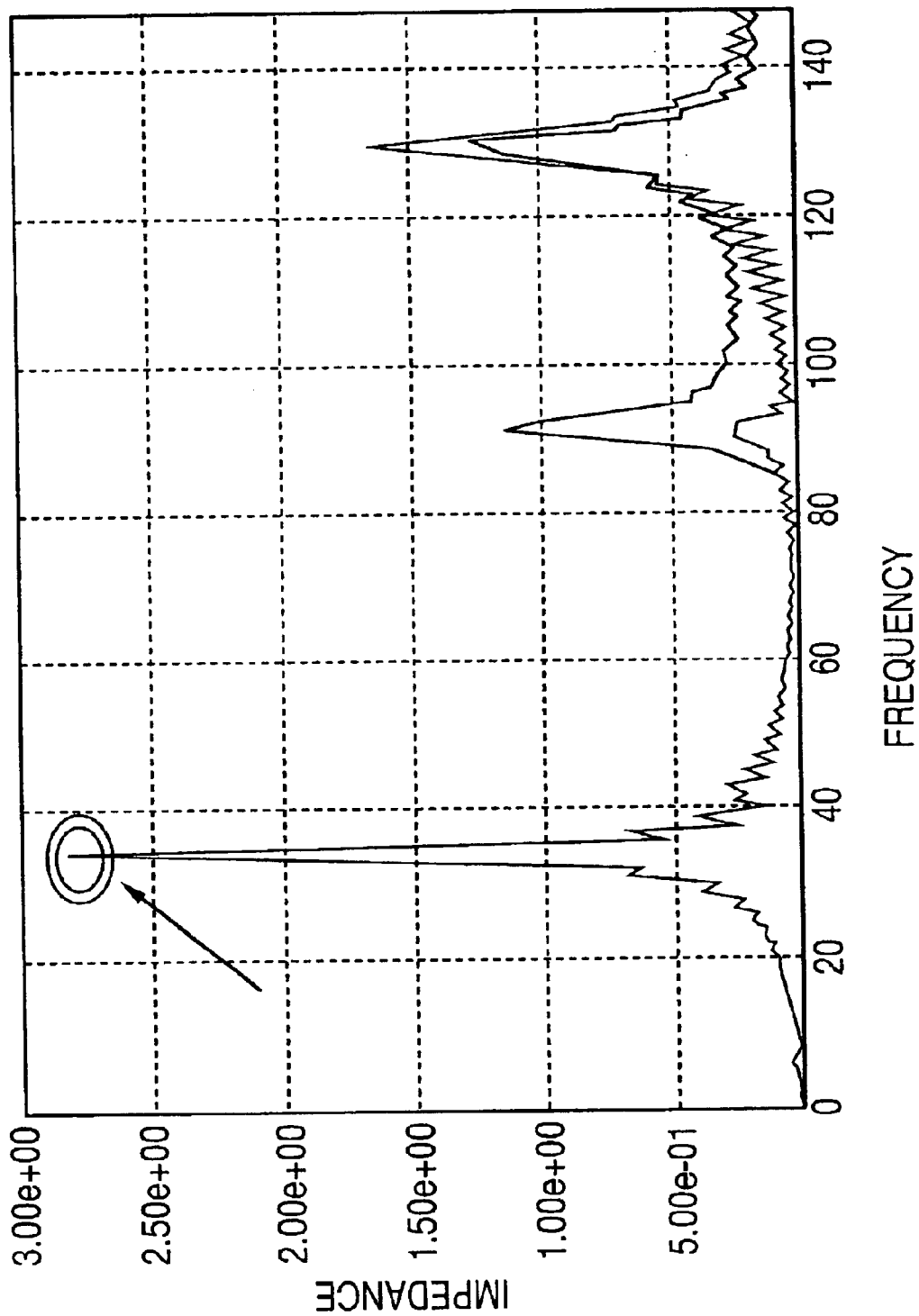
FIG. 5 is a graph of impedance versus frequency for an example power delivery network.

FIG. 5 illustrates a graph of impedance versus frequency for a disadvantageous arrangement. That is, this figure shows an example of resonance provided around 37 MHz that may cause problems in the power delivery to the on-die circuit element.

Figure 6:
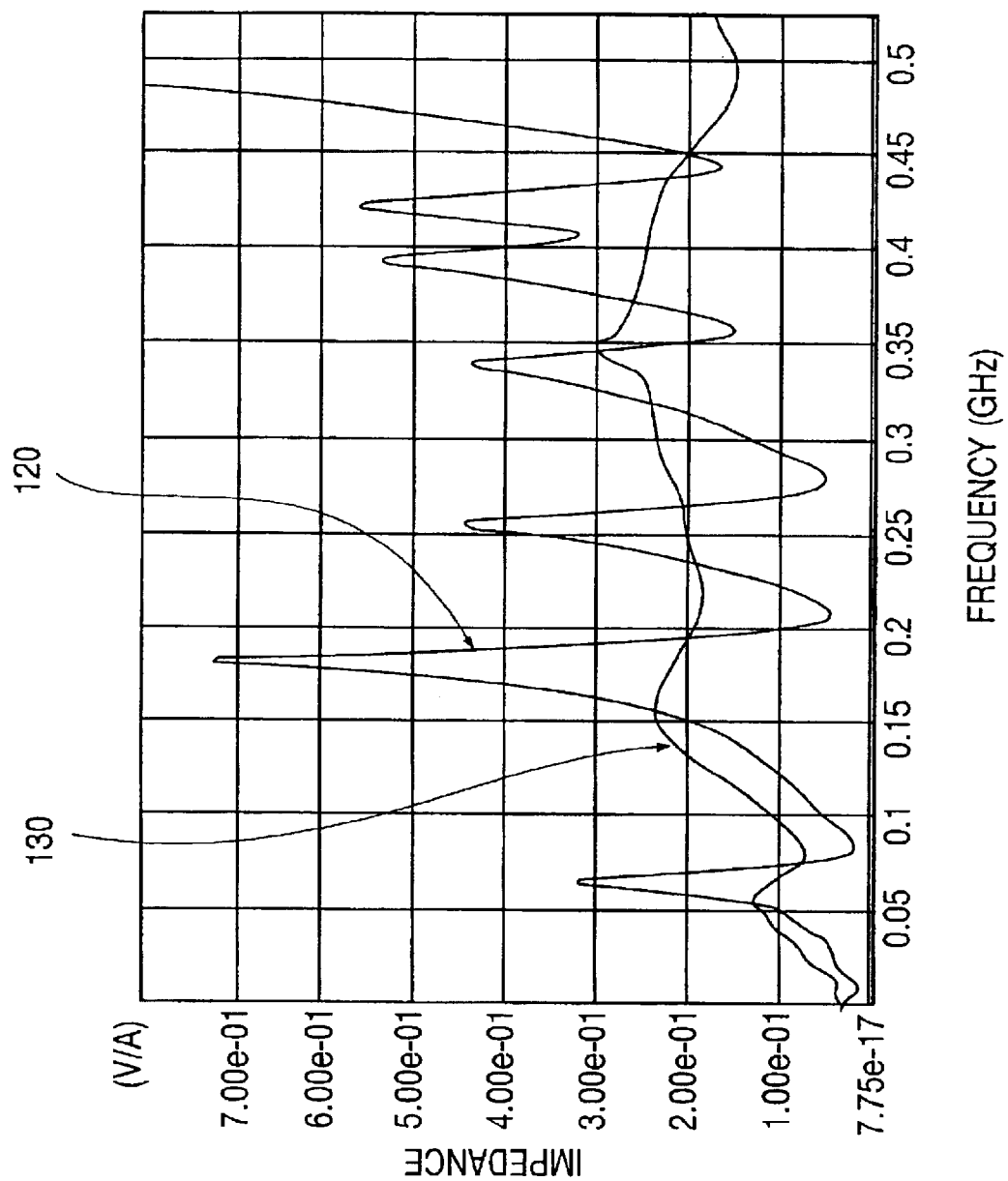
FIG. 6 is a graph of impedance versus frequency for a power delivery network and for a power delivery network according to an example embodiment of the present invention.

FIG. 6 further shows a graph of impedance versus frequency for a disadvantageous arrangement and for a multi-frequency power delivery network according to an embodiment of the present invention. Graph 120 shows the impedance versus frequency plot without the multi-frequency power delivery system (as in disadvantageous arrangements) and graph 130 shows an impedance versus frequency plot for the multi-frequency power delivery system in accordance with an example embodiment of the present invention. As may be seen by comparing the graph 120 and the graph 130, embodiments of the present invention may provide a more constant impedance versus frequency plot that therefore provides a more stable power supply to the on-die buffer 100.

Embodiments of the present invention may be used to provide a high di/dt power delivery system that has low impedance across a full range of frequencies. This may be particularly useful for high-speed I/O power delivery.

Embodiments of the present invention have been described with respect to a package coupled to a die and to a printed circuit board. As is known in the art, there are several types of packages. Flip chip types of packages may have the die mounted face down on the package substrate with direct connection of small solder bumps between the die metal and the package metal. These types of packages may include Flip Chip Ball Grid Array (FCBGA), C4 or Olga type packages. Wirebond types of packages may have the die face up with the back of the silicon connected to the package. There may be tiny wires that are looped over the edge connecting the top of the die connections to the top of the package connections. These packages may include BGA, DIP, PLCC, QFP, for example.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A mechanism for delivering power to an on-die component, said mechanism comprising:
   a package unit having a low frequency delivery path and a high frequency delivery path; and
   a die said on-die component and a capacitive device each coupled in parallel between a first node and a second node, said die further including a low frequency reception path and a high frequency reception path, said low frequency reception path coupled to said low frequency delivery path on said package unit and to said first node, and said high frequency reception path coupled to said high frequency delivery path on said package unit and to said first node.

2. The mechanism of claim 1, wherein said on-die component comprises a buffer circuit.

3. The mechanism of claim 1, wherein said high frequency delivery path on said package unit includes a capacitive element.

4. The mechanism of claim 3, wherein said high frequency delivery path on said package unit further includes a resistive element.

5. The mechanism of claim 4, wherein said resistive element comprises a damping resistor.

6. The mechanism of claim 1, wherein said high frequency reception path on said die includes a resistive element coupled to said first node.

7. The mechanism of claim 1, wherein said resistive element comprises a damping resistor.

8. The mechanism of claim 1, wherein said board comprises a power supply device.

9. The mechanism of claim 1, wherein said die comprises an integrated circuit.

10. A power delivery system comprising:
- a circuit board including a power supply device to provide a voltage signal;
- a package coupled to said board so as to receive said voltage signal and having a first delivery path to provide a first output voltage signal and a second delivery path to provide a second output voltage signal; and
- a die coupled to said package so as to receive said first output voltage signal at a first node and to receive said second output voltage signal at a second node, said die having a capacitive element and a component coupled in parallel between said first node and a third node so as to receive voltage signals from said package, wherein said power delivery system includes a resistive element provided between said second node and said first node.

11. The system of claim 10, wherein said component comprises a buffer circuit.

12. The system of claim 10, wherein said second delivery path on said package unit includes a capacitive element.

13. The system of claim 10, wherein said die comprises an integrated circuit.

14. A power delivery system comprising:
- a package having a first node, a second node, a third node, a fourth node and a fifth node, said package having a first delivery path between said first node and said third node, said package further having a second delivery path between said second node and said fourth node; and
- a die having a sixth node, a seventh node and an eighth node, said sixth node coupled to said third node of said package, said seventh node coupled to said fourth node of said package, said eighth node coupled to said fifth node of said package, said die including a component provided between said seventh node and said eighth node and a capacitive element provided between said sixth node and said eighth node, wherein said power delivery system further includes a resistive element coupled between said second node and said sixth node.

15. The system of claim 14, wherein said component comprises a buffer circuit.

16. The system of claim 14, wherein said second delivery path on said package unit includes a capacitive element.

17. The system of claim 16, wherein said resistive element is provided on said second delivery path between said second node and said fourth node.

18. The system of claim 17, wherein said resistive element comprises a damping resistor.

19. The system of claim 14, wherein said resistive element is provided on said die unit between said seventh node and said sixth node.

20. The system of claim 14, wherein said die comprises an integrated circuit.

21. A power delivery system comprising:
- a power supply;
- a first unit coupled to said power supply at a first input node and a second input node, said first unit including means for providing a low frequency signal at a first output node and means for providing a high frequency signal at a second output node; and
- a second unit including a first input node coupled to said first output node of said first unit and a second input node coupled to said second output node of said first unit, said second unit including a component and a decoupling capacitor coupled in parallel.

22. The system of claim 21, wherein said component comprises a buffer circuit.

23. The system of claim 21, wherein said means for providing a high frequency signal comprises a capacitive element.

24. The system of claim 21, wherein second unit includes a resistive element coupled between said first input node and said second input node of said second unit.

25. The system of claim 24, wherein said resistive element comprises a damping resistor.

26. The system of claim 21, wherein said second unit comprises an integrated circuit.

\* \* \* \* \*